United States Patent
Thanu et al.

(10) Patent No.: US 10,090,188 B2
(45) Date of Patent: Oct. 2, 2018

(54) ROBOT SUBASSEMBLIES, END EFFECTOR ASSEMBLIES, AND METHODS WITH REDUCED CRACKING

(71) Applicant: Applied Materials, Inc., Santa Clara, CA (US)

(72) Inventors: Raj kumar Thanu, Bangalore (IN); Damon K. Cox, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 49 days.

(21) Appl. No.: 15/225,394

(22) Filed: Aug. 1, 2016

(65) Prior Publication Data
US 2017/0323821 A1    Nov. 9, 2017

(30) Foreign Application Priority Data
May 5, 2016 (IN) .............................. 201641015705

(51) Int. Cl.
| | | |
|---|---|---|
| B66F 19/00 | (2006.01) | |
| H01L 21/687 | (2006.01) | |
| B25J 15/00 | (2006.01) | |
| B25J 11/00 | (2006.01) | |

(52) U.S. Cl.
CPC ..... *H01L 21/68707* (2013.01); *B25J 11/0095* (2013.01); *B25J 15/0014* (2013.01)

(58) Field of Classification Search
CPC ............. H01L 21/68707; B25J 11/0095; B25J 15/0014; B25J 17/02
USPC ....................................................... 294/213
See application file for complete search history.

(56) References Cited

U.S. PATENT DOCUMENTS

| | | |
|---|---|---|
| 6,817,640 B2 | 11/2004 | Menon et al. |
| 8,459,140 B2 | 6/2013 | Kent |
| 8,599,531 B2 | 12/2013 | Sundar et al. |
| 9,202,738 B2 | 12/2015 | Greenberg et al. |
| 2003/0133776 A1* | 7/2003 | Lee ................... H01L 21/6838 414/416.03 |
| 2003/0198376 A1 | 10/2003 | Sadighi et al. |
| 2005/0285419 A1* | 12/2005 | Matsumoto ....... H01L 21/67742 294/213 |
| 2008/0257095 A1 | 10/2008 | Kent |
| 2010/0178137 A1 | 7/2010 | Chintalapati et al. |
| 2014/0007731 A1 | 1/2014 | Hosek et al. |
| 2015/0360370 A1 | 12/2015 | Mazzocco et al. |

FOREIGN PATENT DOCUMENTS

| | | |
|---|---|---|
| JP | 10-031812 | 2/1998 |
| JP | 2004-066414 | 3/2004 |

OTHER PUBLICATIONS

International Search Report & Written Opinion of International Application No. PCT/US2017/027076 dated Jul. 13, 2017.

* cited by examiner

*Primary Examiner* — Gabriela M Puig
(74) *Attorney, Agent, or Firm* — Dugan & Dugan, PC (57) ABSTRACT

A robot subassembly including roll, pitch, and/or vertical orientation adjustability capability of a ceramic or glass end effector. The robot subassembly includes a robot component, a mounting plate coupled to the robot component, wherein the mounting plate includes adjustable orientation relative to the robot component, and a brittle ceramic or glass end effector coupled to the mounting plate. Methods of adjusting orientation between a robot component and the end effector, as well as numerous other aspects are disclosed.

15 Claims, 5 Drawing Sheets

ROBOT SUBASSEMBLIES, END EFFECTOR ASSEMBLIES, AND METHODS WITH REDUCED CRACKING

RELATED APPLICATIONS

The present application claims priority to, and the benefit of, Indian Patent Application No. 201641015705 filed on May 5, 2016, and entitled "ROBOT SUBASSEMBLIES, END EFFECTOR ASSEMBLIES, AND METHODS WITH REDUCED CRACKING," the disclosure of which is hereby incorporated by reference herein in its entirety for all purposes.

FIELD

The present disclosure relates to the manufacture of electronic devices, and more specifically to adjustable robotic end effector assemblies and methods for adjusting orientation of brittle ceramic or glass end effectors.

BACKGROUND

In the manufacture of electronic devices, products, and memory articles, precursor articles to such semiconductor wafers (e.g., substrates—both patterned and un-patterned) may be transported within various chambers of the tools by one or more robot apparatus. For example, transport may be from one process chamber to another within a transfer chamber, from a load lock to a process chamber, or from a substrate carrier to a load port in a factory interface. During such robotic transport, the substrates rest on a robotic end effector that is coupled to an arm component of the robot. For example, in a prior art robot, the end effector may couple to a moveable component of the robot, such as a robot wrist. In some cases, the end effector is made of an alumina material in order to accommodate high temperatures and corrosive environmental exposure that may be present in the operating environment. However, existing alumina end effectors (otherwise referred to as "blades") may be prone to relatively high rates of breakage.

Accordingly, end effector apparatus, systems, and methods for having reduced propensity for breakage are sought after.

SUMMARY

According to a first aspect, a robot subassembly is provided. The robot subassembly includes a robot component, a mounting plate coupled to the robot component, wherein the mounting plate includes adjustable orientation relative to the robot component, and a ceramic or glass end effector coupled to the mounting plate.

In another aspect, an end effector assembly is provided. The end effector assembly includes a mounting plate configured to adjustably couple to a robot component, an end effector coupled to the mounting plate, and orientation-adjusting members providing orientation adjustment capability between the robot component and the mounting plate.

In yet another aspect, a method of adjusting an orientation of a ceramic or glass end effector is provided. The method includes providing a robot component, a mounting plate adjustably coupled to the robot component, and the ceramic or glass end effector coupled to the mounting plate, and adjusting one or more of roll, pitch, and vertical orientation of the ceramic or glass end effector relative to the robot component by adjusting one or more gaps between the robot component and the mounting plate.

Numerous other aspects are provided in accordance with these and other embodiments of the disclosure. Other features and aspects of embodiments of the present disclosure will become more fully apparent from the following description, the appended claims, and the accompanying drawings.

DETAILED DESCRIPTION

Electronic device manufacturing processes fabricate a variety of precursor articles to produce the final electronic device (e.g., computer chip), such as semiconductor wafers both patterned and unpatterned, glass plates, masks (all such precursor articles are herein referred to as a "substrate" or "substrates"). During transport of such substrates from one location to another within a manufacturing tool carrying out one or more of the processes, the substrates may be carried by an end effector (sometimes referred to as a "blade"). The substrate rests on the end effector during transport. Because of manufacturing tolerances and tolerance buildups, as part of a calibration process, sometimes the end effector will have its orientation adjusted prior to use so ensure proper orientation of the end effector with various process chambers and/or load lock chambers. In particular, the orientation adjustment may include a roll adjustment, a pitch adjustment, a vertical adjustment, or combinations thereof.

Figure 1A:
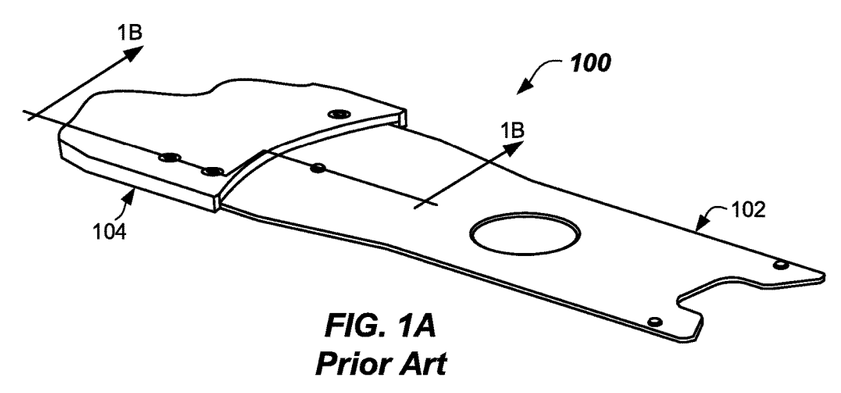
FIG. 1A illustrates an isometric view of a ceramic or glass end effector coupled to a robotic wrist according to the prior art.
Figure 1B:
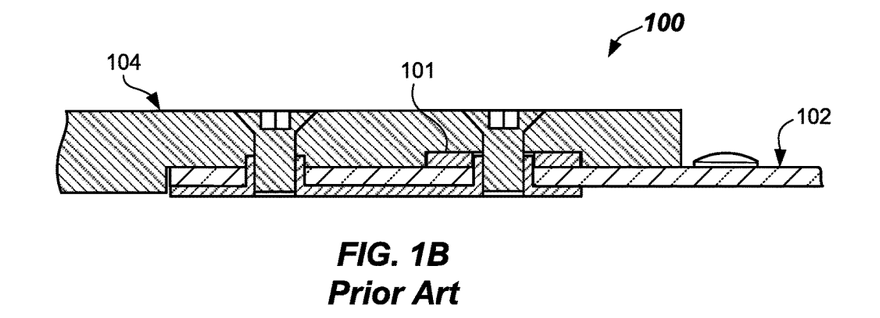
FIG. 1B illustrates a partial cross-sectioned side view of a portion of a ceramic or glass end effector shown coupled to a robot wrist according to the prior art.
Figure 1C:
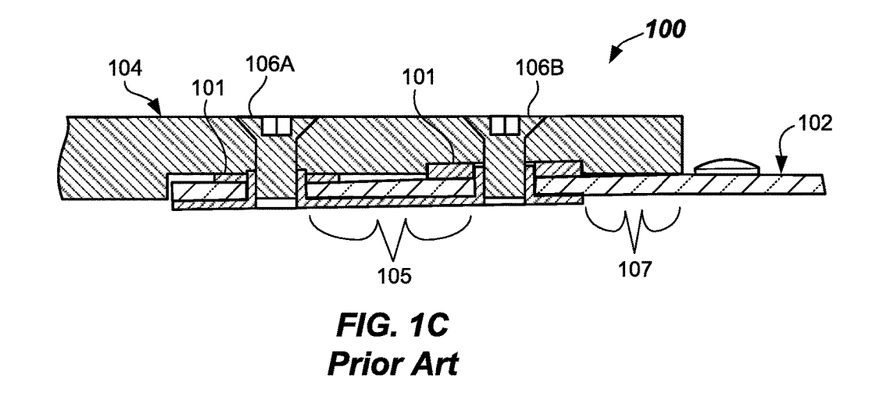
FIG. 1C illustrates a partial cross-sectioned view of a portion of a ceramic or glass end effector shown coupled to a robot wrist and orientation adjusted using shims according to the prior art.

In prior art end effector assemblies 100, the orientation adjustment may be carried out, as shown in FIG. 1A-1C, by providing adjustment capability between the end effector 102 and the robot wrist 104 using one or more shims 101, such as washers, that are inserted between the end effector 102 and the robot wrist 104. If shims 101 are used to adjust one or more of roll, pitch, or vertical orientation of the end effector 102, such as is shown in FIG. 1C, flexing may occur and bending stresses may be imparted onto one or more portions of the end effector 102. In the case of a ceramic or glass end effector, wherein the material is very brittle, this may cause undesirable stresses resulting in cracking in the regions of highest imparted bending stress, such as in region one 105 between the fasteners 106A, 106B, or even outboard of fastener 106B in region two 107. Other regions may be prone to cracking, as well. Ceramic as used herein means hard, brittle, heat-resistant and corrosion-resistant materials made by firing a nonmetallic mineral at a high temperature. Glass as used herein means a clear or translucent vitreous solid, formed by melting pure silica, which can withstand high temperatures. Glass used for end effectors can be made from fused quartz or fused silica.

Embodiments of the present disclosure may reduce or eliminate such ceramic or glass end effector cracking, while still allowing for one or more of roll, pitch, or vertical orientation adjustments. Thus, in accordance with a first aspect, one or more embodiments provide a robot subassembly including a robot component, such as a robot wrist, a mounting plate coupled to the robot component, wherein the mounting plate includes adjustable orientation relative to the robot component, and a ceramic or glass end effector securely coupled to the mounting plate. The adjustable orientation may be provided between the mounting plate and the robot component (e.g., wrist) wherein both members may be metal having relatively high ductility and/or elasticity and thus exhibit an ability to accommodate bending stresses without cracking or breakage. In the improved robot subassembly, the ceramic or glass end effector is rigidly clamped between co-parallel surfaces of the mounting plate and an attachment assembly such that the ceramic or glass end effector is substantially subjected to primarily compressive stresses that are less prone to cause cracking of the ceramic or glass end effector.

These and other embodiments of end effector assemblies, robot subassemblies, and methods of adjusting an orientation of an end effector are described below with reference to FIGS. 2A-5, wherein like numerals are used throughout to denote like elements.

Figure 2A:
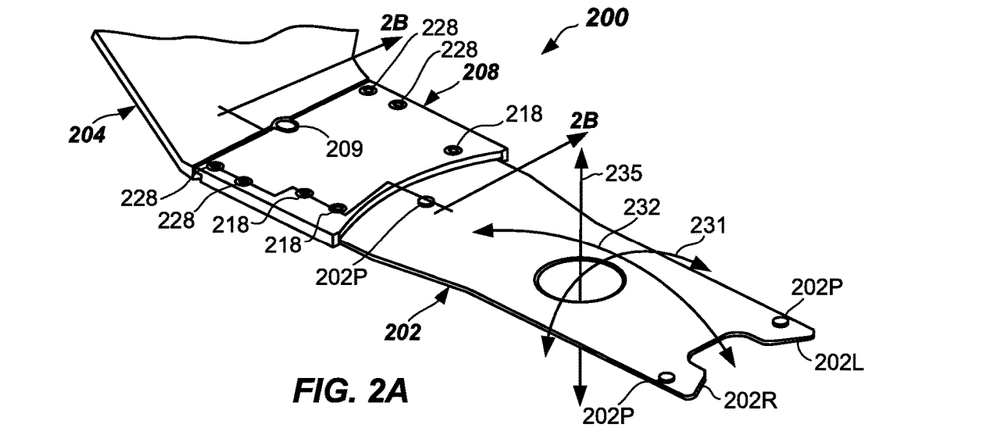
FIG. 2A illustrates an isometric view of a robot subassembly according to one or more embodiments.
Figure 2B:
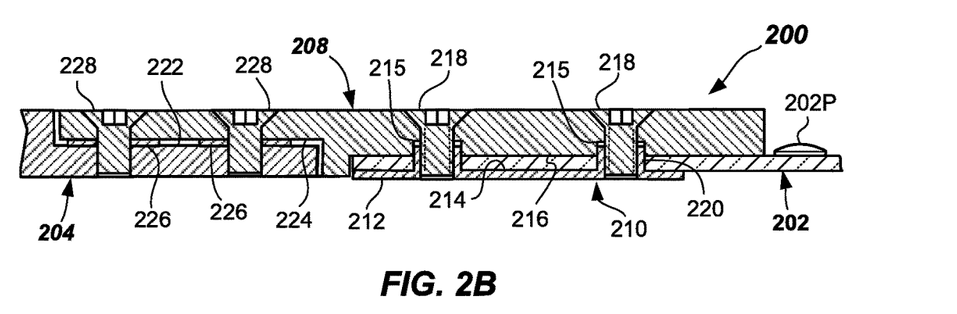
FIG. 2B illustrates a partial cross-sectioned side view of a robot subassembly taken along section line 2B-2B of FIG. 2A according to one or more embodiments.

FIGS. 2A-2B illustrate partial isometric and cross-sectioned views of the robot subassembly 200 and various components thereof according to one or more embodiments of the present disclosure. The robot subassembly 200 includes a robot component 204, which may be an outboard-most robot component such as a robot wrist, and a mounting plate 208 coupled to the robot component 204, wherein the mounting plate 208 includes an adjustable orientation relative to the robot component 204. The outboard-most robot component is the robot arm component that is the furthest away from the shoulder joint of the robot. The mounting plate 208 is an intermediate member between the robot component 204 and the ceramic or glass end effector 202. Although the mounting plate 208 is shown as a plate-like structure, other configurations may be used. The robot subassembly 200 further includes a ceramic or glass end effector 202 securely coupled to the mounting plate 208 (shown truncated in FIG. 2B). The adjustable orientation allows for one or more of roll, pitch, or vertical adjustment, or combination of adjustments, of the relative orientation between the end effector 202 and the robot component 204, but the adjustment takes place between the robot component 204 and the mounting plate 208. This allows the ceramic or glass end effector 202 to be adjusted to a proper orientation to the process chambers and/or load lock chambers of the tool, and do so with minimal cracking of the ceramic or glass end effector 202.

Figure 2C:
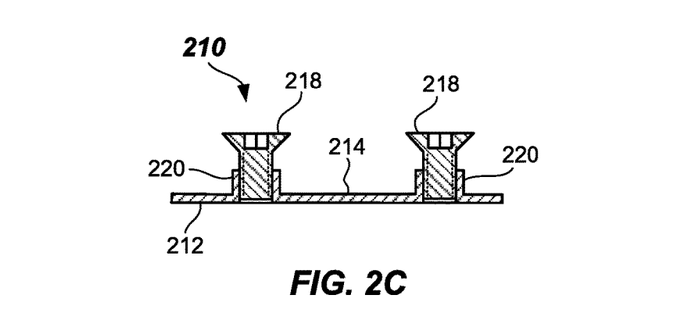
FIG. 2C illustrates a partial cross-sectioned side view of an attachment assembly for attachment of an end effector according to one or more embodiments.

As is best shown in FIGS. 2A and 2B, the ceramic or glass end effector 202 is securely fastened and attached to the mounting plate 208 by an attachment assembly 210 (shown in FIGS. 2B and 2C). The ceramic or glass end effector 202 may be made of a suitable ceramic material such as alumina, alumina-titania ceramic, or the like, or from a suitable glass such as fused silica, fused quartz, or the like, for example. The portion of the ceramic or glass end effector 202 that is coupled to the mounting plate 208 may be thin and may have top and bottom surfaces that are substantially parallel to one another. The thickness of the ceramic or glass end effector 202 may be about 1.5 mm to about 5 mm, for example. Other thicknesses may be used. The thickness of the ceramic or glass end effector 202 may be the same throughout the clamped portion.

The ceramic or glass end effector 202 may include contact pads 202P, which may be of any suitable shape, such as round, oval, square, hexagonal, octagonal, or rectangular. Other shapes may be used. Preferably, two contact pads 202P may be spaced apart in a lateral direction, such as on legs 202L, 202R, and at least one more may be elsewhere provided on the ceramic or glass end effector 202. In some embodiments, the contact pads 202P may provide at least three-point contact with a substrate (not shown) thus providing a gap between the substrate and the top surface of the ceramic or glass end effector 202.

The contact pads 202P may be machined integrally onto the ceramic body in some embodiments, or alternatively fastened to the ceramic body by any suitable means, such as press fitting, sintering, adhering, fastening with mechanical fasteners (e.g., screws), or the like. The contact pads 202P may have a flat or a domed profile.

The attachment assembly 210 may be made up of an attachment plate 212, which may be coupled to an underside of the mounting plate 208 (as depicted), and end effector fasteners 218. The attachment plate 212 may include an upper surface 214, which may be provided in contact with the underside of the ceramic or glass end effector 202. The attachment plate 212 may be metal (e.g., aluminum or stainless steel).

The mounting plate 208 may include a lower surface 216 (as depicted), which may be provided in contact with the upper side of the ceramic or glass end effector 202. Each of the lower surface 216 and upper surface 214 may be planar surfaces which are co-parallel and may be drawn into secure clamping engagement with the ceramic or glass end effector 202 by tightening end effector fasteners 218. End effector fasteners 218 may be suitable screws, such as chamfered-head screws shown. Other suitable fastening systems and/or fasteners may be used to clamp the ceramic or glass end effector 202 to the mounting plate 208. The clamping may impart largely compressive stresses to the clamped portion of the ceramic or glass end effector 202 over a relatively large area (e.g., an area of about 5,000 mm$^2$ or more) thus minimizing bending stresses. Thus, the propensity for cracking of the ceramic or glass end effector may be reduced.

The attachment plate 212, as best shown in FIG. 2C, may include threaded pilots 220 that receive end effector fasteners 218 therein. The threaded pilots 220 may pass through mounting holes formed in the ceramic or glass end effector 202 and may be received in recesses 215 formed in the underside of the mounting plate 208 (shown in FIG. 2B). The number of end effector fasteners 218 and threaded pilots 220 may number three or more and may be positioned on the mounting plate 208 as shown in FIG. 2A, for example. Other orientations of the end effector fasteners 218 may be used. Optionally, in some embodiments, the attachment plate 212 may be made of sheet metal with PEM® brand fasteners available from Penn Engineering & Manufacturing Corp. installed therein. Other configurations of the attachment plate 212 are possible.

In some embodiments, a polyimide tape may be applied to the top and/or bottom of the ceramic or glass end effector 202 to further improve clamping and to minimize local stress concentrations.

Again referring to FIGS. 2A and 2B, one method and apparatus of providing the adjustable orientation and coupling of the robot component 204 to the mounting plate 208 is shown. In particular, the robot component 204 (e.g., robot wrist) may include a first recess 222, and the mounting plate 208 may include a second recess 224. These recesses 222, 224 allow the alignment of the upper and lower surfaces of the robot component 204 and the mounting plate 208 so that the robot subassembly 200 may exhibit a relatively thin vertical profile, while the steps formed in each may also aid in assembly.

The adjustable orientation between the robot component 204 and the mounting plate 208 may be provided, in one or more embodiments, by inserting one or more shims 226 (e.g., thin disc shaped washers) between the respective surfaces of the robot component 204 and the mounting plate 208. Shims 226 may be inserted over the component fasteners 228 in some embodiments. Shims 226 may be made of a stainless steel material. The shims 226 may vary in thickness, depending on the amount of adjustment in roll, pitch, and/or vertical.

For example, the shims 226 may vary in thickness from between about 0.025 mm to about 0.305 mm, for example. Other thicknesses of shims 226 or shim materials may be used. One or several shims 226 may be used at each adjustment location. The adjustment locations may include three or more locations, such as the four locations shown. Varying amounts of shims 226 (possibly of differing thicknesses) may be placed at one or more of the locations to aid in orientation adjustment by providing variable gaps.

However, it should be recognized that other types of shims 226 and locations of shims 226 may be used. Shims 226 may have any suitable shape, thickness, and location that provides for attaining variable gaps at various locations to provide orientation adjustment between the robot component 204 and the mounting plate 208 thus adjusting the orientation of the end effector 202 in roll, pitch, and/or vertical. The shims 226 may be clamped between the robot component 204 and the mounting plate 208 by tightening component fasteners 228. Component fasteners 228 may be chamfered-head screws, for example. Other suitable fasteners may be used. Each of the mounting plate 208 and the robot component 204 may be metal, such as aluminum, stainless steel or other suitable metal and may be subject to bending stresses and yet not plastically yield or crack as they are much more elastic and ductile than ceramic or glass materials. When the shoulders of the component fasteners 228 center themselves within the mating chamfers formed on the mounting plate 208, the tightening of the component fasteners 228 fixes the X and Y position of the mounting plate relative to the robot component 204. In some embodiments, a locating pin 209 may be provided to assist in roughly locating the mounting plate 208 to the robot component 204.

Figure 2D:
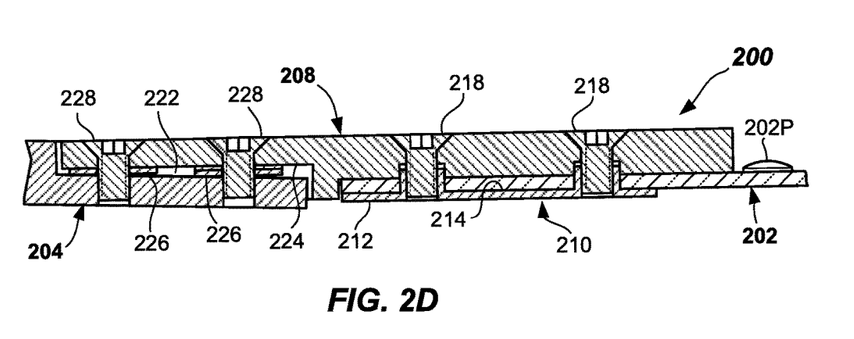
FIG. 2D illustrates a partial cross-sectioned side view of a robot subassembly including shims for orientation adjustment between the robot component and the mounting plate according to one or more embodiments.

FIG. 2D illustrates a partial cross-sectioned side view of a robot subassembly 200 including shims 226 between the robot component 204 and the mounting plate 208 according to one or more embodiments. The addition of shims 226 at various locations may provide for roll, pitch and/or vertical adjustments.

Figure 2E:
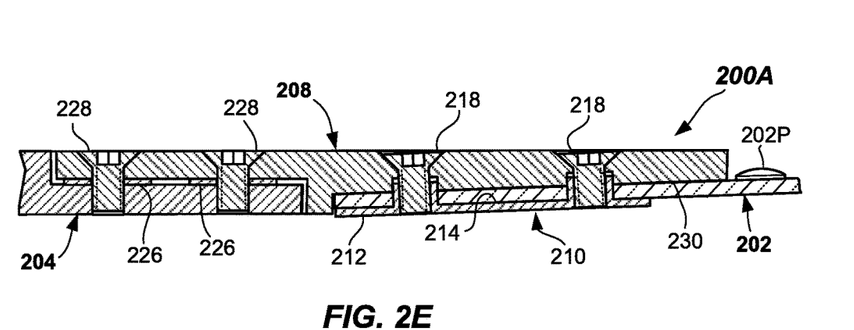
FIG. 2E illustrates a partial cross-sectioned side view of a robot subassembly including shims for orientation adjustment and further including an inclined surface on the end effector attachment surface of the mounting plate according to one or more embodiments.

FIG. 2E illustrates a partial cross-sectioned side view of a robot subassembly 200A including an inclined surface 230 formed as a end effector attachment surface of the mounting plate 208. The inclined surface 230 may include an angle to the horizontal of greater than about 0.2 degrees, or even of between about 0.2 degrees and 2 degrees. Other angles are possible. The inclined surface 230 may be set to approximately offset for pitch changes due to droop of the ceramic or glass end effector 202 and other robot components when extended into the various chambers (e.g., process chambers and/or load lock chambers). In some instances fewer shims 226 may be used to achieve a horizontal orientation.

Figure 2F:
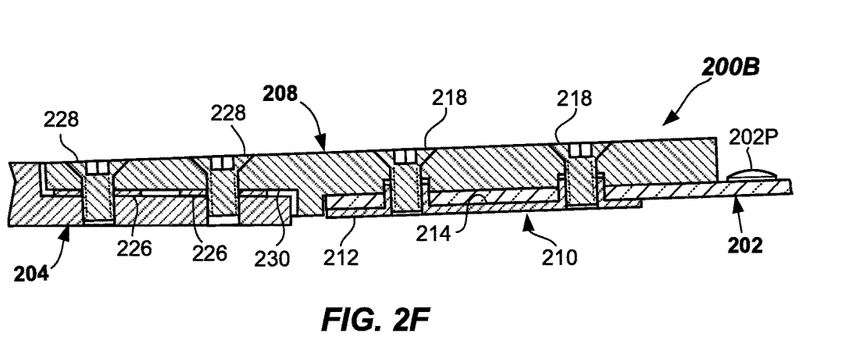
FIG. 2F illustrates a partial cross-sectioned side view of a robot subassembly including shims for orientation adjustment and further including an inclined surface on the robot component attachment surface of the mounting plate according to one or more embodiments.

FIG. 2F illustrates a cross-sectioned side view of a robot subassembly 200B including an inclined surface 230 formed as a robot component attachment surface of the mounting plate 208 according to one or more embodiments. Again, the inclined surface 230 may accommodate for and correct expected droop and bring the ceramic or glass end effector 202 to a more horizontal initial position before orientation adjustment. Combinations of inclined surfaces on the robot component attachment surface and the end effector attachment surface may be used. Alternatively, an inclined surface may be placed on the robot component to accommodate for droop.

Figure 3A:
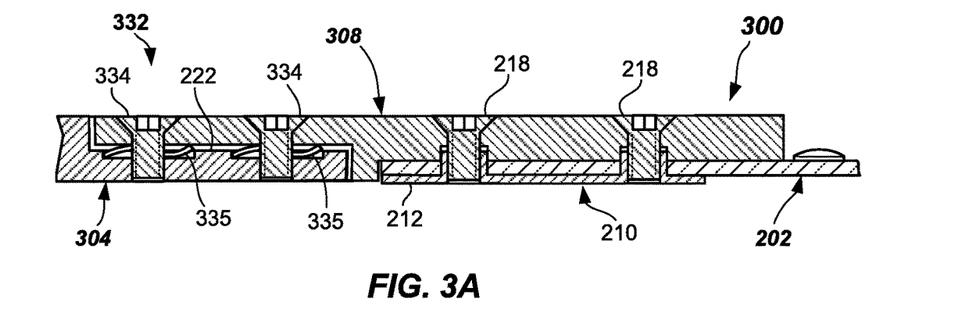
FIG. 3A illustrates a partial cross-sectioned side view of a robot subassembly including a set and lock adjustment mechanism showing the setting elements according to one or more embodiments.
Figure 3B:
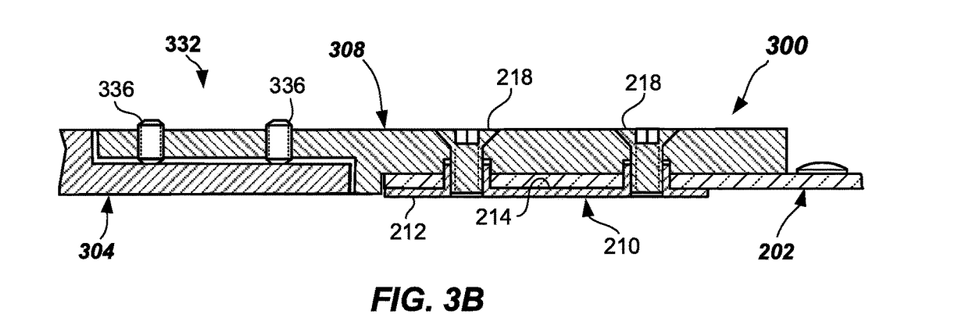
FIG. 3B illustrates a cross-sectioned side view of a robot subassembly including a set and lock adjustment mechanism showing the locking elements according to one or more embodiments.
Figure 3C:
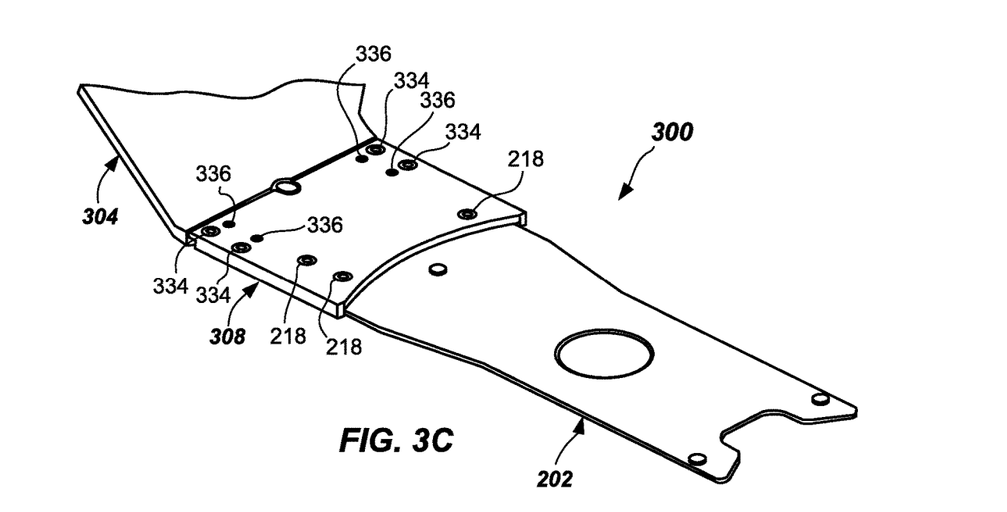
FIG. 3C illustrates an isometric view of a robot subassembly showing possible locations for the set and lock elements of the set and lock adjustment mechanism according to one or more embodiments.

Furthermore, other types or orientation adjustment means may be used, such as a set and lock mechanism 332 of robot subassembly 300 shown in FIGS. 3A-3C. In the set and lock mechanism 332, the orientation between the robot component 304 and the mounting plate 308 may be accomplished by three or more adjustment screws 334 provided at different locations on the mounting plate 308 (four being shown in FIG. 3C). The adjustment screws 334 may be adjusted to allow relatively different gaps between the robot component 304 and the mounting plate 308 at the different locations. The different gaps set are maintained under the force exerted by spring members 335 received between the mounting plate 308 and the robot component 304. The spring members 335 may be wave springs or any other suitable spring type. Once the proper orientation is set by adjustment (in or out) of the adjustment screws 334, locking screws 336 (shown in FIGS. 3B and 3C) may be set to fix the relative orientation in roll, pitch, and/or vertical between the robot component 304 and the mounting plate 308 by fixing the gaps at the various adjustment locations. Tightening the locking screws 336 against the surface of the robot component pushes the head of the adjustment screws 334 against the mounting plate 308 and fixes the gaps. The locking screws 336 may be located proximate to the adjustment screws 334 or elsewhere at suitable locations. The connection to the ceramic or glass end effector 202 is the same as previously described in FIGS. 2A-2C.

Orientation adjustment, accomplished by the position adjustable attachment between the robot component 204 and the mounting plate 208, as shown in FIG. 2A, may include roll adjustment 231, pitch adjustment 232, vertical adjustment 235, or combinations thereof. The orientation adjustment is provided for by orientation adjusting members (e.g., one or more shims 226 or adjustment screws 334) that cause variable-size gaps between the robot component 204, 304 and the mounting plate 208, 308 at different locations. For example, a roll adjustment 231 is where one side of the ceramic or glass end effector 202 is raised or lowered relative to the other side by adding or subtracting shims 226 side-to-side or by suitably adjusting one side of a set and lock mechanism 332. A pitch adjustment 232 may be where one longitudinal end of the ceramic or glass end effector 202 (e.g., legs 202L, 202R) is raised or lowered relative to the other end, such as by adding or subtracting shims 226 along the length of the mounting plate 208, or by adjusting adjustment screws 334 of the set and lock mechanism 332. For example, adding shims 226 closer to the robot component 204 lowers the legs 202L, 202R, whereas adding shims 226 closer to the ceramic or glass end effector 202 raises the legs 202L, 202R. Vertical adjustment 235 may be accomplished by adding or subtracting shims 226 or adjusting adjustment screws 334 of the set and lock mechanism 332. Vertical adjustment 235 may be by adding shims 226 equally at each location or by equally adjusting the adjustment screws 334, for example. Combinations of the foregoing may be adjusted by different thickness shims added at different locations or different adjustments to adjustment screws 334.

Figure 4:
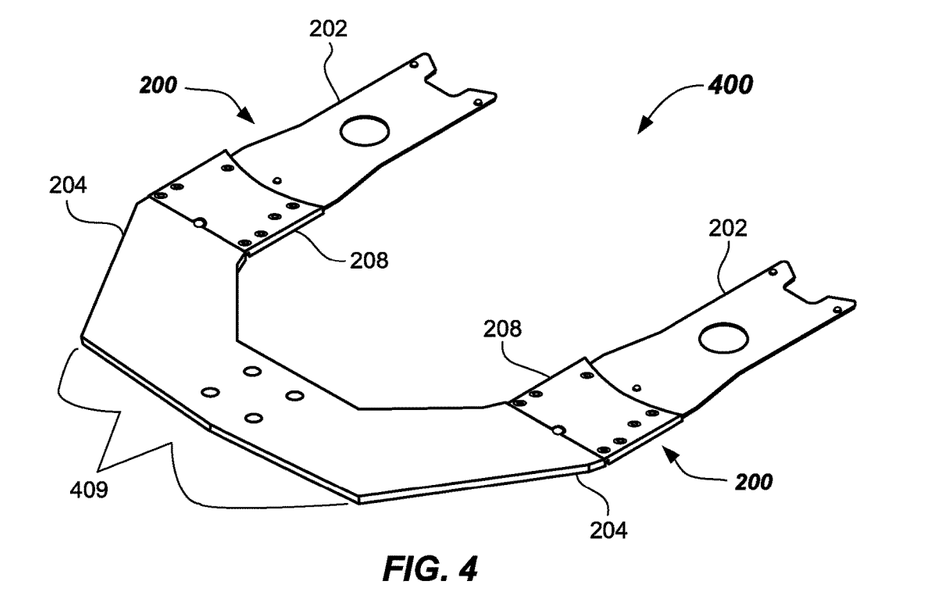
FIG. 4 illustrates an isometric view of a robot subassembly according to one or more embodiments.

FIG. 4 illustrates a robot subassembly 400 adapted for transporting substrates between electronic device manufacturing system chambers. The robot subassembly 400 includes a rigid beam 409 and coupled robot components 204, such as a robot wrists coupled at the opposite ends of the rigid beam 409. In the depicted embodiment, the rigid beam 409 may attach to one or more additional robot components of a robot (not shown), which may be provided in a transfer chamber of a mainframe housing (not shown). Robot assemblies 200, as previously described, couple to the rigid beam 409. The robot subassembly 400 may be configured and adapted to transport substrates to and from various chambers of a tool, such as to and from process chambers, and to and from load lock chambers, for example. In the depicted embodiment, the roll, pitch, and vertical adjustments may be made individually to each of the ceramic or glass end effectors 202. Although a certain twinned robot construction is shown, the robot may be any form of robot, such as a three-link robot, four-link robot, a Selective Compliance Articulated Robot Arm (SCARA) robot, or independently-controllable-arm robot. Other types of robots may be employed and benefit from embodiments of the disclosure. For example, the robot subassembly 200 may be adapted for use with the robots described in U.S. Pat. Nos. 5,789,878; 5,879,127; 6,267,549; 6,379,095; 6,582,175; and 6,722,834; and US Pat. Pubs. 2010/0178147; 2013/0039726; 2013/0149076; 2013/0115028; and 2010/0178146, for example. Likewise, robot subassembly 300 of FIGS. 3A-3C may be adapted to any suitable robot.

Figure 5:
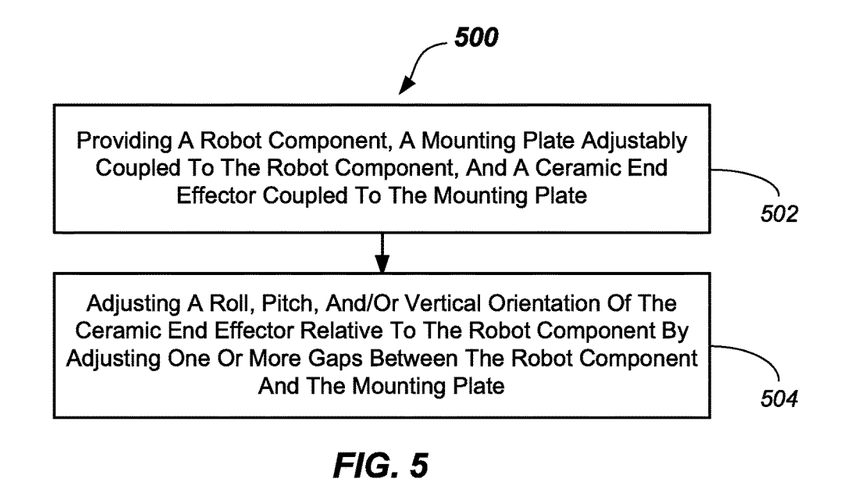
FIG. 5 illustrates a flowchart of a method of adjusting an orientation of an end effector according to one or more embodiments.

FIG. 5 illustrates a method 500 of adjusting an orientation of a ceramic or glass end effector 202 relative to a robot component 204, 304. The method 500 includes, in 502, providing a robot component (e.g., robot component 204, 304), a mounting plate (e.g., mounting plate 208, 308) adjustably coupled to the robot component, and a ceramic or glass end effector (e.g., ceramic or glass end effector 202) coupled to the mounting plate.

The method 500 includes, in 504, adjusting a roll orientation, a pitch orientation, and/or a vertical orientation, or combinations of a roll orientation, a pitch orientation, and/or a vertical orientation, of the ceramic or glass end effector (e.g., ceramic or glass end effector 202) relative to the robot component (e.g., robot component 204, 304) by adjusting one or more gaps between the robot component and the mounting plate. As described above, adjustment of the gap may be by any suitable gap adjustment means, such as adding or subtracting shims 226, adjusting a set and lock mechanism 332, or the like.

The foregoing description discloses example embodiments of the disclosure. Modifications of the above-disclosed assemblies, apparatus, and methods which fall within the scope of the disclosure will be readily apparent to those of ordinary skill in the art. Accordingly, while the disclosure includes several embodiments thereof, it should be understood that other embodiments may fall within the scope of the disclosure as defined by the appended claims.

What is claimed is:

1. A robot subassembly, comprising:
   a robot component;
   a mounting plate coupled to the robot component, wherein the mounting plate includes an adjustable orientation relative to the robot component; and
   a ceramic or glass end effector coupled to the mounting plate,
   wherein the adjustable orientation of the mounting plate is provided by one or more shims placed between the mounting plate and the robot component.

2. The robot subassembly of claim 1, wherein the ceramic or glass end effector is securely attached to the mounting plate by an attachment assembly, the attachment assembly including:
   an attachment plate, and
   fasteners coupled between the mounting plate and the attachment plate.

3. The robot subassembly of claim 1, wherein the ceramic or glass end effector comprises alumina.

4. The robot subassembly of claim 1, wherein the robot component comprises an outboard-most robot component.

5. The robot subassembly of claim 1, wherein the robot component comprises a robot wrist.

6. The robot subassembly of claim 1, wherein the robot component comprises a beam having multiple robot wrists disposed thereon.

7. The robot subassembly of claim 1, wherein the mounting plate comprises an inclined surface configured to adjust for droop of the ceramic or glass end effector.

8. The robot subassembly of claim 7, wherein the inclined surface comprises a ceramic or glass end effector attachment surface.

9. The robot subassembly of claim 7, wherein the inclined surface comprises a robot component attachment surface.

10. The robot subassembly of claim 1, wherein the adjustable orientation of the mounting plate relative to the robot component comprises adjustment of one or more of:
   a) roll adjustment;
   b) pitch adjustment; and
   c) vertical adjustment.

11. A robot subassembly, comprising:
a robot component;
a mounting plate having a inboard end and an outboard end, the inboard end exclusively coupled to the robot component, wherein the mounting plate includes an adjustable orientation relative to the robot component; and
a ceramic or glass end effector exclusively coupled to the outboard end of the mounting plate, wherein the adjustable orientation is provided by a set and lock mechanism, and the set and lock mechanism comprises spring members and set screws between the robot component and the mounting plate and the spring members and set screws are exclusively located at the inboard end.

12. The robot subassembly of claim 11, wherein the set and lock mechanism comprises locking screws.

13. An end effector assembly, comprising:
a mounting plate configured to adjustably couple to a robot component;
a ceramic or glass end effector coupled to the mounting plate; and
orientation adjusting members providing orientation adjusting capability between the robot component and the mounting plate,
wherein the orientation adjusting members comprise one or more shims placed between the mounting plate and the robot component.

14. The end effector assembly of claim 13, wherein the orientation adjusting members cause variable-size gaps between the robot component and the mounting plate at different locations.

15. A method of adjusting an orientation of a ceramic or glass end effector, comprising:
providing a robot component, a mounting plate adjustably coupled to the robot component, and the ceramic or glass end effector coupled to the mounting plate; and
adjusting one or more of a roll, a pitch, and a vertical orientation of the ceramic or glass end effector relative to the robot component by adjusting one or more gaps between the robot component and the mounting plate by one or more shims placed between the mounting plate and the robot component.

* * * * *